United States Patent
Okamoto et al.

(10) Patent No.: US 11,856,713 B2
(45) Date of Patent: Dec. 26, 2023

(54) MULTILAYER RESIN SUBSTRATE AND METHOD OF MANUFACTURING MULTILAYER RESIN SUBSTRATE

(71) Applicant: Murata Manufacturing Co., Ltd., Nagaokakyo (JP)

(72) Inventors: Masanori Okamoto, Nagaokakyo (JP); Takeshi Osuga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 196 days.

(21) Appl. No.: 17/471,219

(22) Filed: Sep. 10, 2021

(65) Prior Publication Data
US 2021/0410296 A1  Dec. 30, 2021

Related U.S. Application Data

(63) Continuation of application No. PCT/JP2020/013909, filed on Mar. 27, 2020.

(30) Foreign Application Priority Data

Mar. 29, 2019 (JP) .................................. 2019-066817

(51) Int. Cl.
*H05K 1/02* (2006.01)
*H05K 1/03* (2006.01)
(Continued)

(52) U.S. Cl.
CPC ......... *H05K 3/4632* (2013.01); *H05K 3/4069* (2013.01); *H05K 3/4614* (2013.01); *H05K 2201/0129* (2013.01)

(58) Field of Classification Search
CPC ............ H05K 1/012; H05K 1/02; H05K 1/03; H05K 1/0271; H05K 1/036; H05K 1/11;
(Continued)

(56) References Cited

U.S. PATENT DOCUMENTS 5,092,032 A * 3/1992 Murakami ............. H05K 3/243
29/830
6,429,388 B1 * 8/2002 Interrante ............ B23K 35/262
257/E23.068
(Continued)

FOREIGN PATENT DOCUMENTS

JP  2001-160686 A  6/2001
JP  2003243573 A  8/2003
(Continued)

OTHER PUBLICATIONS

Official Communication issued in International Patent Application No. PCT/JP2020/013909, dated Jun. 16, 2020.

*Primary Examiner* — Xiaoliang Chen
(74) *Attorney, Agent, or Firm* — Keating & Bennett, LLP

(57) ABSTRACT

A multilayer resin substrate includes a stacked body including resin layers stacked on each other, a first planar conductor on a resin layer, and an interlayer connection conductor on a resin layer. The interlayer connection conductor includes a first interlayer connection conductor connected to an external conductor, and a second interlayer connection conductor bonded to the first interlayer connection conductor and a planar conductor. The first and second interlayer connection conductors are made of different materials. The second interlayer connection conductor includes a constricted portion including a smaller planar cross-sectional area than a different portion, between a bonding portion to which the first interlayer connection conductor is bonded and a bonding portion to which the planar conductor is bonded.

10 Claims, 8 Drawing Sheets

(51) Int. Cl.
  *H05K 1/11*    (2006.01)
  *H05K 3/00*    (2006.01)
  *H05K 3/12*    (2006.01)
  *H05K 3/40*    (2006.01)
  *H05K 3/16*    (2006.01)
  *H01L 23/12*   (2006.01)
  *H01L 23/528*  (2006.01)
  *H01L 23/538*  (2006.01)
  *H01L 23/488*  (2006.01)
  *H05K 3/46*    (2006.01)

(58) Field of Classification Search
  CPC ........ H05K 1/115; H05K 3/00; H05K 3/0026; H05K 3/12; H05K 3/40; H05K 3/46; H05K 3/243; H05K 3/3426; H05K 3/4038; H05K 3/4069; H05K 3/4617; H05K 3/4614; H05K 3/4632; H05K 3/4647; H05K 3/4676; H05K 2201/0129; H01L 23/12; H01L 23/145; H01L 23/528; H01L 23/538; H01L 23/488; H01L 23/562; H01L 24/03; H01L 24/10; H01L 24/11; H01L 24/13; H01L 24/14; H01L 24/16; H01L 24/17; H01L 24/75; H01L 24/81; H01L 24/83; H01L 24/92; H01L 24/95; H01L 24/96; H01L 24/97; H01L 2224/0401; H01L 2224/05552; H01L 2224/13009; H01L 2224/13109; H01L 2224/27003; H01L 2224/81005; H01L 2224/81203
  USPC ........ 174/255, 260, 261; 257/669, 737, 772; 438/107, 108, 123; 29/830, 832, 846, 29/847
  See application file for complete search history.

(56) References Cited

U.S. PATENT DOCUMENTS

| | | | | |
|---|---|---|---|---|
| 2010/0263923 | A1* | 10/2010 | Kodani | H05K 1/115 29/846 |
| 2012/0205145 | A1* | 8/2012 | Sakai | H05K 3/4632 156/60 |
| 2013/0049189 | A1* | 2/2013 | Mawatari | H01L 25/0657 257/737 |
| 2014/0060899 | A1 | 3/2014 | Park et al. | |
| 2014/0193952 | A1* | 7/2014 | Lin | H01L 24/75 438/108 |
| 2014/0217595 | A1* | 8/2014 | Sakurai | H01L 24/10 257/772 |
| 2014/0252607 | A1* | 9/2014 | Miyauchi | B23K 35/302 228/111.5 |
| 2014/0299986 | A1* | 10/2014 | Sakurai | H01L 24/81 257/737 |
| 2015/0050778 | A1* | 2/2015 | Asahi | H01L 24/83 156/583.1 |
| 2015/0179615 | A1* | 6/2015 | Watanabe | H01L 25/0657 257/737 |
| 2016/0086893 | A1* | 3/2016 | Wu | H01L 23/145 257/669 |
| 2019/0203369 | A1* | 7/2019 | Si | C25D 3/38 |
| 2019/0261517 | A1* | 8/2019 | Harada | H01L 23/12 |
| 2019/0287895 | A1* | 9/2019 | Tajima | H01L 23/53257 |
| 2020/0113050 | A1* | 4/2020 | Sato | H05K 1/036 |
| 2020/0273837 | A1* | 8/2020 | Onozeki | H01L 24/81 |

FOREIGN PATENT DOCUMENTS

| | | |
|---|---|---|
| JP | 2004079554 A | 3/2004 |
| JP | 2004-273575 A | 9/2004 |
| JP | 2006-253189 A | 9/2006 |
| JP | 2009-188146 A | 8/2009 |
| JP | 2010-123829 A | 6/2010 |
| JP | 2014047349 A | 3/2014 |
| WO | 2011/058938 A1 | 5/2011 |

* cited by examiner

MULTILAYER RESIN SUBSTRATE AND METHOD OF MANUFACTURING MULTILAYER RESIN SUBSTRATE

CROSS REFERENCE TO RELATED APPLICATIONS

This application claims the benefit of priority to Japanese Patent Application No. 2019-066817 filed on Mar. 29, 2019 and is a Continuation Application of PCT Application No. PCT/JP2020/013909 filed on Mar. 27, 2020. The entire contents of each application are hereby incorporated herein by reference.

BACKGROUND OF THE INVENTION

1. Field of the Invention

The present invention relates to a multilayer resin substrate, and more particularly, to a multilayer resin substrate including a plurality of resin layers that are stacked on each other, and also relates to a method of manufacturing such a multilayer resin substrate.

2. Description of the Related Art

Conventionally, a multilayer resin substrate including a stacked body including a plurality of resin layers stacked on each other, and a planar conductor and an interlayer connection conductor that are provided on the plurality of resin layers has been known.

For example, Japanese Unexamined Patent Application Publication No. 2001-160686 discloses a multilayer resin substrate that includes a planar conductor (a conductor pattern) provided on any resin layer, a cylindrical first interlayer connection conductor (a plated via) disposed inside a hole provided in the resin layer, and a cylindrical second interlayer connection conductor (a conductive bonding material) bonding the first interlayer connection conductor and another conductor. According to the above-described configuration, the planar conductor and the different conductor are able to be easily connected through interlayer connection conductors (the first interlayer connection conductor and the second interlayer connection conductor that are bonded to each other).

However, in the configuration disclosed in Japanese Unexamined Patent Application Publication No. 2001-160686, stress generated when the multilayer resin substrate is bent or when an external force is applied to the multilayer resin substrate concentrates on a bonding portion between the planar conductor and the interlayer connection conductor, so that peeling (damage) easily occurs in the bonding portion. In particular, in a case in which the bonding portion between the planar conductor and the interlayer connection conductor (a bonding portion between the planar conductor and the second interlayer connection conductor, for example) is a boundary surface between different materials with low mechanical strength, peeling in the bonding portion occurs even more easily.

SUMMARY OF THE INVENTION

Preferred embodiments of the present invention, in a configuration in which a planar conductor and another conductor are connected through an interlayer connection conductor including a first interlayer connection conductor and a second interlayer connection conductor that are bonded to each other, provide multilayer resin substrates and methods of manufacturing multilayer resin substrates that are each capable of significantly reducing or preventing peeling in a bonding portion between the planar conductor and the interlayer connection conductor when an external force is applied to a stacked body.

A multilayer resin substrate according to a preferred embodiment of the present invention includes a stacked body including a plurality of resin layers stacked on each other, a first planar conductor on one of the plurality of resin layers, and an interlayer connection conductor on one of the plurality of resin layers and connected to the first planar conductor, and the interlayer connection conductor includes a first interlayer connection conductor, a second interlayer connection conductor made of a material different from a material of the first interlayer connection conductor and bonded to the first interlayer connection conductor and a different conductor, and the second interlayer connection conductor includes a constricted portion including a smaller planar cross-sectional area than a different portion of the second interlayer connection conductor, between a bonding portion to which the first interlayer connection conductor is bonded and a bonding portion to which the different conductor is bonded.

In a structure including a bonding portion between a planar conductor and an interlayer connection conductor, stress generated when an external force is applied to a multilayer resin substrate easily concentrates on the bonding portion (a boundary surface) between the planar conductor and the interlayer connection conductor. Therefore, when an external force is applied to a multilayer resin substrate, peeling easily occurs in the bonding portion between the planar conductor and the interlayer connection conductor. In particular, in a case in which the bonding portion between the planar conductor and the interlayer connection conductor is a boundary surface between different materials with low mechanical strength, peeling even more easily occurs in the bonding portion.

On the other hand, according to the configuration described above, stress applied to the second interlayer connection conductor when the external force is applied to the multilayer resin substrate is largely applied to the constricted portion including a smaller planar cross-sectional area than a different portion. Therefore, in comparison with a case in which the second interlayer connection conductor does not include the constricted portion, the stress applied to the bonding portion when an external force is applied is reduced, and peeling in the bonding portion between the planar conductor and the interlayer connection conductor is significantly reduced or prevented.

A method of manufacturing a multilayer resin substrate according to a preferred embodiment of the present invention includes a planar conductor forming step of forming a first planar conductor on one of a plurality of resin layers, a first interlayer conductor forming step of forming a first interlayer connection conductor to be connected to the first planar conductor inside a through hole provided in one of the plurality of resin layers after the planar conductor forming step, a conductive member forming step of forming a conductive member on a surface of the first interlayer connection conductor after the first interlayer conductor forming step, the conductive member being made of a material different from a material of the first interlayer connection conductor, and a stacked body forming step of forming a stacked body by stacking, heating, and pressing the plurality of resin layers such that the conductive member comes into contact with a different conductor formed on one of the plurality of resin layers, after the conductive member forming step, changing the conductive member into a second interlayer connection conductor to be bonded to the first interlayer connection conductor and the different conductor, and forming a constricted portion including a smaller planar cross-sectional area than a different portion, between a bonding portion to which the first interlayer connection conductor is bonded and a bonding portion to which the different conductor is bonded, in the second interlayer connection conductor.

A method of manufacturing a multilayer resin substrate according to a preferred embodiment of the present invention includes a planar conductor forming step of forming a first planar conductor on one of a plurality of resin layers, a first interlayer conductor forming step of forming a first interlayer connection conductor to be connected to the first planar conductor inside a through hole provided in one of the plurality of resin layers after the planar conductor forming step, a conductive member forming step of forming a conductive member at a portion that faces the first interlayer connection conductor when the plurality of resin layers are stacked in a subsequent step, after the first interlayer conductor forming step, the portion being included in a different conductor formed on one of the plurality of resin layers, the conductive member being made of a material different from a material of the first interlayer connection conductor, and a stacked body forming step of forming a stacked body by stacking, heating, and pressing the plurality of resin layers such that the conductive bonding material comes into contact with a different conductor formed on one of the plurality of resin layers, after the conductive member forming step, changing the conductive member into a second interlayer connection conductor to be bonded to the first interlayer connection conductor and the different conductor, and forming a constricted portion having a smaller planar cross-sectional area than a different portion, between a bonding portion to which the first interlayer connection conductor is bonded and a bonding portion to which the different conductor is bonded, in the second interlayer connection conductor.

According to such a manufacturing method, in a configuration with the interlayer connection conductor including the first interlayer connection conductor and the second interlayer connection conductor that are bonded to each other, a multilayer resin substrate capable of significantly reducing or preventing peeling in the bonding portion between the planar conductor and the interlayer connection conductor when an external force is applied to a stacked body is able to be easily obtained.

According to preferred embodiments of the present invention, in a configuration in which a planar conductor and another conductor are connected through an interlayer connection conductor including a first interlayer connection conductor and a second interlayer connection conductor that are bonded to each other, multilayer resin substrates each capable of significantly reducing or preventing peeling in a bonding portion between the planar conductor and the interlayer connection conductor when an external force is applied to a stacked body are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
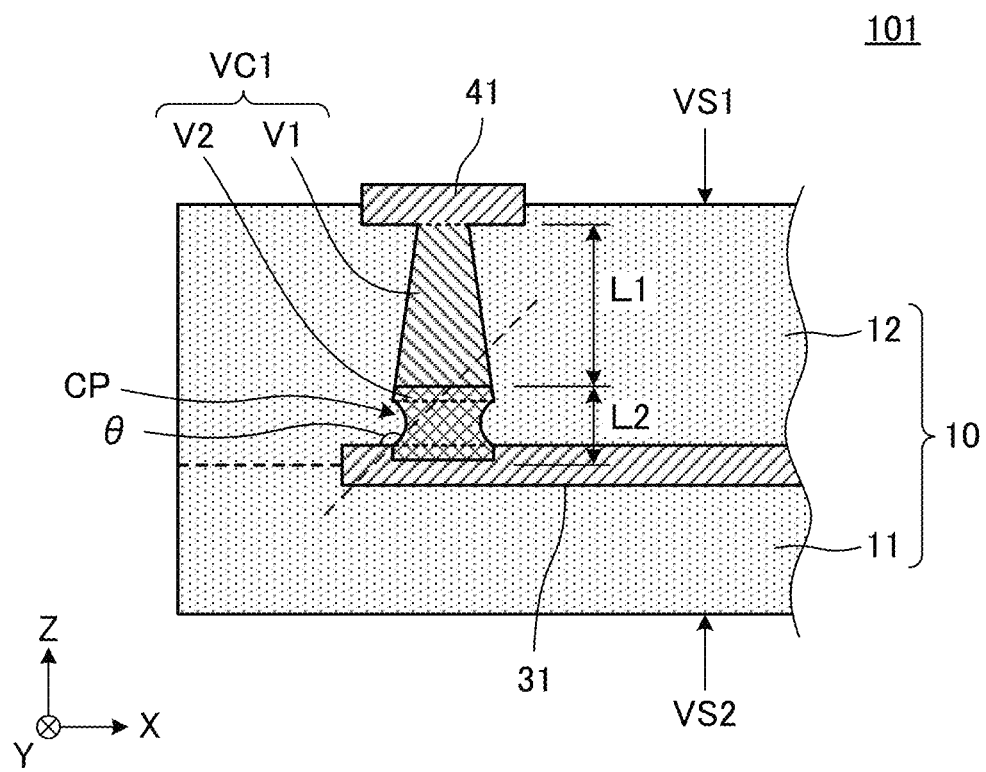
FIG. 1A is a cross-sectional view showing a portion of a multilayer resin substrate 101 according to a first preferred embodiment of the present invention.

Hereinafter, preferred embodiments of the present invention will be described in detail with reference to the attached drawings and several specific examples. In the drawings, components and elements assigned with the same reference numerals or symbols represent identical or substantially identical components and elements. While preferred embodiments of the present invention are divided and described for the sake of convenience in consideration of ease of description or understanding of main points, elements described in different preferred embodiments are able to be partially replaced and combined with each other. In the second and subsequent preferred embodiments, a description of matters common to the first preferred embodiment will be omitted and only different points will be described. In particular, the same advantageous functions and effects by the same or substantially the same configurations will not be described one by one for each preferred embodiment.

First Preferred Embodiment

Figure 1B:
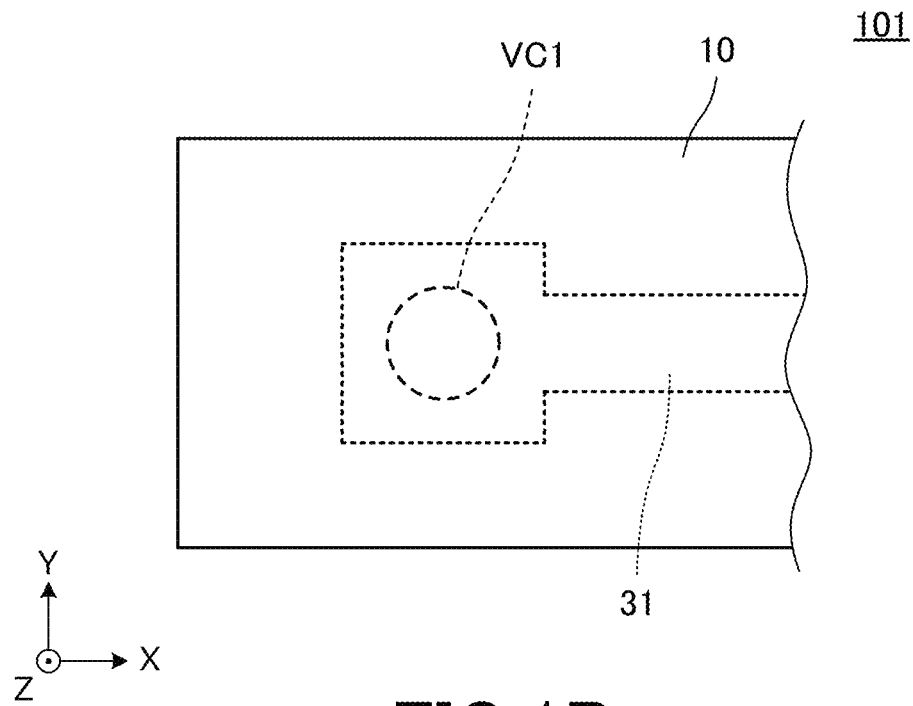
FIG. 1B is a plan view showing the portion of the multilayer resin substrate 101.

FIG. 1A is a cross-sectional view showing a portion of a multilayer resin substrate 101 according to a first preferred embodiment of the present invention, and FIG. 1B is a plan view showing the portion of the multilayer resin substrate 101. In FIG. 1B, an illustration of an external conductor 41 is omitted in order to make the structure easy to understand.

The multilayer resin substrate 101 includes a stacked body 10, an internal conductor 31, an external conductor 41, and an interlayer connection conductor VC1 (a first interlayer connection conductor V1 and a second interlayer connection conductor V2). As mainly shown in FIG. 1A, the internal conductor and the external conductor 41 are connected to each other through the interlayer connection conductor VC1.

The stacked body 10 has a rectangular or substantially rectangular planar shape of which a longitudinal direction coincides with an X-axis direction, and includes a first main surface VS1 and a second main surface VS2 that face each other. The stacked body 10 is provided by stacking a plurality of resin layers 11 and 12 made of a resin material (for example, a thermoplastic resin). The plurality of resin layers 11 and 12 are sheets made of a liquid crystal polymer (LCP), for example, as a main material.

The external conductor 41 is provided on a first main surface VS1 of the stacked body 10, and the internal conductor 31 and the interlayer connection conductor VC1 are provided inside the stacked body 10. In the present preferred embodiment, the external conductor 41 corresponds to a "first planar conductor", and the internal conductor 31 corresponds to a "different conductor" and a "second planar conductor".

The internal conductor 31 is provided on a surface of the resin layer 11. The internal conductor 31 is a linear conductor pattern extending in the X-axis direction. The internal conductor 31 has a wide portion of which a line width is larger than other portions on a first end (a right end of the internal conductor 31 in FIG. 1B). The internal conductor 31 is a conductor pattern such as Cu foil, for example.

The rectangular or substantially rectangular external conductor 41 is provided on a surface of the resin layer 12. The external conductor 41 is a conductor pattern such as Cu foil, for example.

In addition, the interlayer connection conductor VC1 is provided on the resin layer 12. The interlayer connection conductor VC1 includes a first interlayer connection conductor V1 and a second interlayer connection conductor V2. As shown in FIG. 1A, the first interlayer connection conductor V1 is connected to the external conductor 41 (a first planar conductor), and the second interlayer connection conductor V2 is bonded to the first interlayer connection conductor V1 and the first end of the internal conductor 31 (a different conductor).

The second interlayer connection conductor V2 includes a constricted portion CP having a smaller planar cross-sectional area than a different portion, between a bonding portion (at a top side of the second interlayer connection conductor V2 in FIG. 1A) of the first interlayer connection conductor V1 and a bonding portion (at a bottom side of the second interlayer connection conductor V2 in FIG. 1A) of the internal conductor 31. Although not shown, the constricted portion CP is provided over an entire or substantially an entire periphery of a side surface of the second interlayer connection conductor V2.

In the present preferred embodiment, the first interlayer connection conductor V1 and the second interlayer connection conductor V2 are made of different materials. Specifically, the second interlayer connection conductor V2 is made of a material having a lower melting point than the material of the first interlayer connection conductor V1.

The first interlayer connection conductor V1 is a plated via (a plated through hole or a plated filled via) made of Cu as a main component, the plated via being provided inside a through hole provided in the resin layer 12 by a plating process, for example. In addition, the second interlayer connection conductor V2 is Cu—Sn alloy to be generated, for example, when an Sn plating film provided on a surface of the first interlayer connection conductor V1 by a plating process is alloyed with the first interlayer connection conductor V1 or the like made of Cu as a main component during heating and pressing (when the resin layers 11 and 12 are stacked, heated, and pressed).

The external conductor 41 (the first planar conductor) and the first interlayer connection conductor V1 are made of the same material (for example, Cu). In addition, in the present preferred embodiment, the first interlayer connection conductor V1 has a truncated conical shape (a tapered shape) with a small area on one surface (a top surface of the first interlayer connection conductor V1 in FIG. 1A) and a large area on an opposite surface (a bottom surface), and the one surface of the first interlayer connection conductor V1 is connected to the external conductor 41, and the opposite surface of the first interlayer connection conductor V1 is bonded to the second interlayer connection conductor V2.

It is to be noted that the first interlayer connection conductor V1 and the second interlayer connection conductor V2 according to the present preferred embodiment include no resin material. In addition, as shown in FIG. 1A, a thickness (L1) in a Z-axis direction (a thickness direction or a stacking direction) of the first interlayer connection conductor V1 is larger than a thickness (L2) of the second interlayer connection conductor V2 (L1>L2).

Moreover, an external angle θ between the second interlayer connection conductor V2 and the internal conductor 31 according to the present preferred embodiment is preferably an obtuse angle. As a result, stress that contributes to peeling that occurs on a boundary surface of the second interlayer connection conductor V2 and the internal conductor 31 is able to be reduced.

With the multilayer resin substrate 101 according to the present preferred embodiment, the following advantageous effects may be obtained.

(a) The second interlayer connection conductor V2 according to the present preferred embodiment includes a constricted portion CP having a smaller planar cross-sectional area than a different portion, between a bonding portion of the first interlayer connection conductor V1 and a bonding portion of the internal conductor 31 (a different conductor). According to such a configuration, stress applied to the second interlayer connection conductor V2 when an external force is applied to the multilayer resin substrate is largely applied to the constricted portion CP having a smaller planar cross-sectional area than a different portion. Therefore, in comparison with a case in which the second interlayer connection conductor V2 does not include the constricted portion CP, the stress applied to a bonded surface between the planar conductor (the external conductor 41 and the internal conductor 31) and the interlayer connection conductor VC1 when the external force is applied is reduced, and thus peeling in the bonding portion between the planar conductor and the interlayer connection conductor VC1 is significantly reduced or prevented.

In addition, the constricted portion CP of the second interlayer connection conductor V2 that has a relatively small planar cross-sectional area is easier to deform than other portions. Therefore, the stress applied to the bonding portion between the planar conductor and the interlayer connection conductor VC1 when the external force is applied to the multilayer resin substrate 101 is reduced.

(b) In the present preferred embodiment, the first interlayer connection conductor V1 is a plated through hole (or a plated filled via) of, for example, Cu provided by a plating process and is made of the same material (Cu) as a material of the external conductor 41 (the first planar conductor). According to such a configuration, the first interlayer connection conductor V1 and the external conductor 41 are integrated together, so that an intermetallic compound is rarely provided at a portion connecting the first interlayer connection conductor V1 and the external conductor 41, and thus the mechanical strength of the portion connecting the first interlayer connection conductor V1 and the external conductor 41 is increased.

(c) In the present preferred embodiment, the first interlayer connection conductor V1 and the external conductor 41 are made of the same material (for example, Cu), the one side (a surface with a smaller area) of the first interlayer connection conductor V1 having a truncated conical shape is connected to the external conductor 41, and the opposite side (a surface with a larger area) is connected to the second interlayer connection conductor V2. Generally, the bonding strength is low when a bonded area between the interlayer connection conductor and the conductor is small, so that the bonding strength between the one surface of the interlayer connection conductor having a truncated conical shape and the external conductor 41 tends to be low. In contrast, in the present preferred embodiment, the first interlayer connection conductor V1 provided by a plating process is integrated with the external conductor 41, and thus the strength in the bonding portion is high even when the bonded area between the first interlayer connection conductor V1 and the external conductor 41 is small.

(d) As described above, the second interlayer connection conductor V2 is, for example, Cu—Sn alloy to be generated when an Sn plating film provided on a surface of the first interlayer connection conductor V1 is alloyed with the first interlayer connection conductor V1 or the like made of Cu as a main component during heating and pressing. Therefore, the first interlayer connection conductor V1 and the second interlayer connection conductor V2 include no resin material. As described above, in a case in which the second interlayer connection conductor V2 is provided by a plating film, no resin material remains inside as with a case in which the second interlayer connection conductor V2 is provided by conductive paste, which makes it possible to reduce conductor loss of an interlayer connection conductor.

(e) In the present preferred embodiment, the thickness (L1) in the Z-axis direction of the first interlayer connection conductor V1 made of Cu is larger than the thickness (L2) of the second interlayer connection conductor V2 made of Cu—Sn alloy (L1>L2). While, in a case in which a multilayer resin substrate is provided by stacking a plurality of resin layers on each other, a low melting point material is used for a conductive member CM so that the resin layers may be adhered to each other in a low-temperature state during heating and pressing, many of such low melting point materials have lower conductivity than the first interlayer connection conductor V1 (the plated via of Cu). In contrast, in the present preferred embodiment, the thickness of the first interlayer connection conductor V1 with relatively high conductivity is large, so that, in comparison with a case in which the thickness of the second interlayer connection conductor V2 is larger than the thickness of the first interlayer connection conductor V1, the conductor loss of a circuit provided on the multilayer resin substrate is able to be reduced. Therefore, a multilayer resin substrate having excellent high-frequency characteristics is able to be obtained.

(f) Further, in the present preferred embodiment, both of the plurality of resin layers 11 and 12 in the stacked body 10 are made of a thermoplastic resin. According to this configuration, as will be described below, the resin layers 11 and 12 may flow at the time of forming (during heating and pressing) the stacked body 10, and thus the constricted portion CP is easy to be provided on a side of the second interlayer connection conductor V2. In addition, according to this configuration, as will be described below, the stacked body 10 is easily provided by stacking, and heating and pressing (collectively pressing) the plurality of resin layers 11 and 12, so that the number of steps of manufacturing the multilayer resin substrate 101 is reduced, and the cost is able to be reduced to a low level. Further, with this configuration, a multilayer resin substrate capable of being easier to plastically deform and maintaining (holding) a desired shape is able to be obtained.

Figure 2:
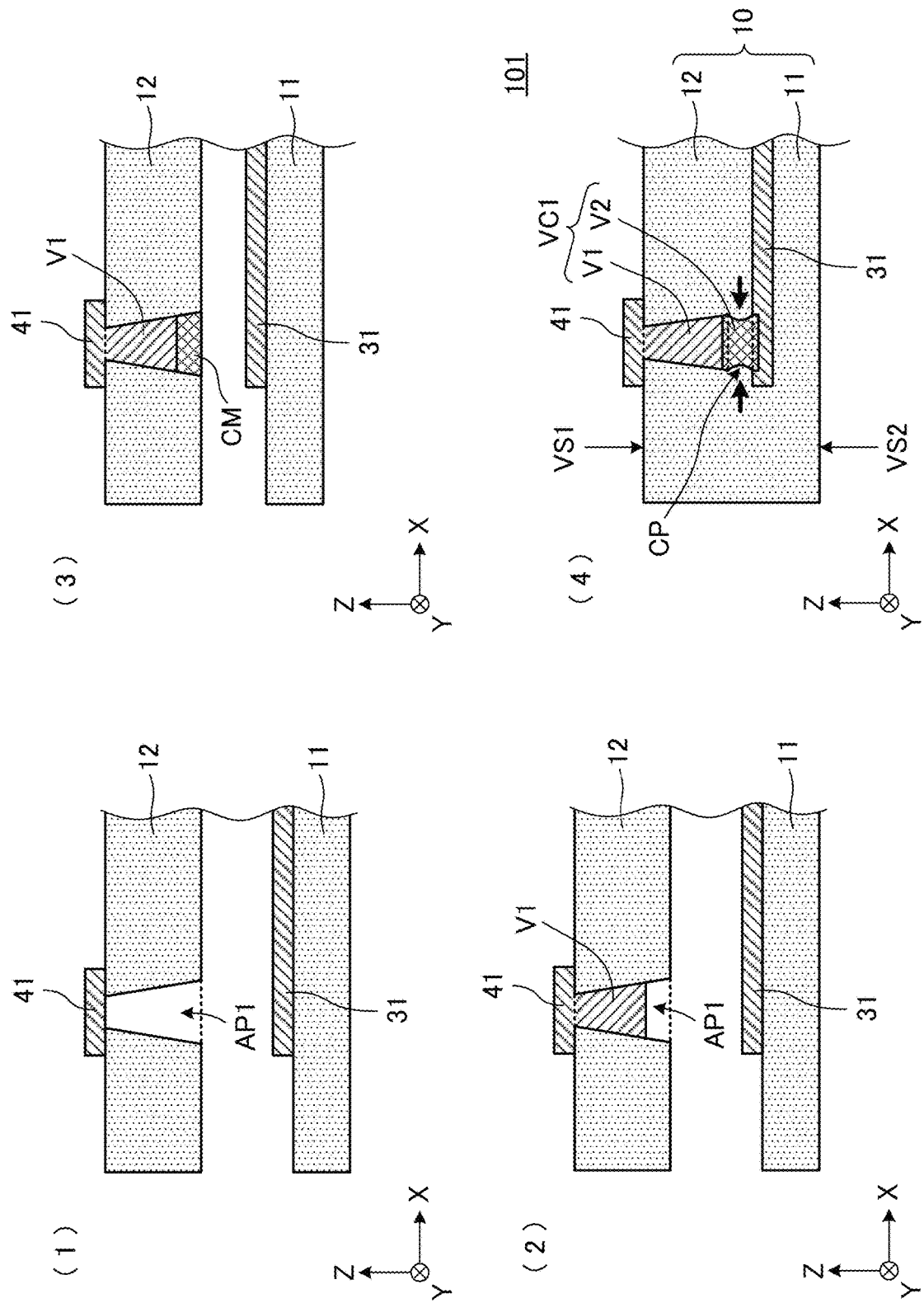
FIG. 2 is a cross-sectional view sequentially showing steps of manufacturing the multilayer resin substrate 101.

The multilayer resin substrate 101 according to the present preferred embodiment is manufactured, for example, in the following steps. FIG. 2 is a cross-sectional view sequentially showing steps of manufacturing the multilayer resin substrate 101. In FIG. 2, for the sake of convenience of explanation, although explanation is provided in a manufacturing process with one chip (an individual piece), the actual process of manufacturing a multilayer resin substrate is performed in the state of a collective substrate.

First, as shown in (1) in FIG. 2, a plurality of resin layers 11 and 12 are prepared. The resin layers 11 and 12 are sheets made of a thermoplastic resin such as a liquid crystal polymer (LCP), for example, as a main material.

Next, an internal conductor 31 and an external conductor 41 are formed in the plurality of resin layers 11 and 12, respectively. Specifically, metal foil (Cu foil, for example) is laminated on front surfaces of the resin layers 11 and 12, and the metal foil is patterned by, for example, photolithography to form the internal conductor 31 on the front surface of the resin layer 11 and to form the external conductor 41 on the front surface of the resin layer 12.

As described above, this step of forming the first planar conductor (the external conductor 41) in either of the plurality of resin layers 11 and 12 is an example of a "planar conductor forming step".

Next, as shown in (2) in FIG. 2, the first interlayer connection conductor V1 is formed in the resin layer 12. Specifically, after the "planar conductor forming step," a position overlapping the external conductor 41 is irradiated with a laser from a back surface (a surface opposite to the surface on which the external conductor 41 is provided) of the resin layer 12 so as to form a through hole AP1 having a truncated conical shape (a tapered shape) with an opening diameter reducing from the back surface of the resin layer 12 toward the front surface of the resin layer 12. Subsequently, for example, a Cu-plating film is provided inside the through hole AP1 so as to form a first interlayer connection conductor V1 having a truncated conical shape (a tapered shape) with a smaller area on one surface (a top surface) to be connected to the external conductor 41 and a larger area on an opposite surface (a bottom surface).

As described above, this step of forming the first interlayer connection conductor V1 connecting to a first planar conductor (the external conductor 41) inside the through hole AP1 after providing the through hole AP1 in the resin layer 12 after the "planar conductor forming step", is an example of a "first interlayer conductor forming step".

Subsequently, as shown in (3) in FIG. 2, a conductive member CM is formed in the resin layer 12. Specifically, after the "first interlayer conductor forming step," the conductive member CM (an Sn plating film) is formed on the opposite surface (the bottom surface) of the first interlayer connection conductor V1.

As described above, this step of forming the conductive member CM on the surface of the first interlayer connection conductor V1 after the "first interlayer conductor forming step" is an example of a "conductive member forming step".

Next, as shown in (4) in FIG. 2, a stacked body 10 is formed by stacking, heating, and pressing of the plurality of resin layers 11 and 12. Specifically, the plurality of resin layers 11 and 12 are stacked in this order so that the conductive member CM comes into contact with the internal conductor 31 (the different conductor), and are subjected to isotropic pressing while being heated (about 300 degrees, for example). At such a time, for example, the conductive member CM being an Sn plating film is alloyed with the first interlayer connection conductor V1 and the internal conductor 31 that are made of Cu as a main component to be Cu—Sn alloy (the second interlayer connection conductor V2), and is bonded to the first interlayer connection conductor V1 and the internal conductor 31.

In a case in which the conductive member CM is a low melting point metal such as Sn, the conductive member CM is softened by being heated to a temperature equal to or higher than the melting point of the conductive member CM during heating and pressing. During heating and pressing, a side of the softened conductive member CM deformed by being pressed by flowing resin (see the arrow shown in (4) in FIG. 2). As a result, a constricted portion CP having a smaller planar cross-sectional area than a different portion is formed, between a bonding portion (a top side) of the first interlayer connection conductor V1 and a bonding portion (a bottom side) of the internal conductor 31, and on the side of the second interlayer connection conductor V2 after heating and pressing.

As described above, this step of forming the stacked body 10 by stacking, heating, and pressing of the plurality of resin layers 11 and 12 after the "conductive member forming step" while changing the conductive member CM into the second interlayer connection conductor V2, and forming the constricted portion CP in the second interlayer connection conductor V2 is an example of a "stacked body forming step".

According to this manufacturing method, in the configuration in which the interlayer connection conductor VC1 includes the first interlayer connection conductor V1 and the second interlayer connection conductor V2 that are bonded to each other, a multilayer resin substrate capable of significantly reducing or preventing peeling in the bonding portion between the planar conductor and the interlayer connection conductor VC1 when an external force is applied to the stacked body 10 is able to be easily obtained.

According to the manufacturing method, the stacked body 10 (the multilayer resin substrate 101) is able to be easily formed by heating and pressing (collectively pressing) the plurality of resin layers 11 and 12. Therefore, the number of steps of manufacturing the multilayer resin substrate 101 is reduced, and the cost is able to be reduced to a low level. Further, in the present preferred embodiment, the plurality of resin layers 11 and 12 made of a thermoplastic resin are easy to flow during heating and pressing, and thus, it is easy to form the constricted portion CP on a side of the second interlayer connection conductor V2.

In addition, according to the manufacturing method, the conductive member CM (a plating film) is able to be formed on the opposite surface of the first interlayer connection conductor V1 by a plating process from the back surface of the resin layer 12 on which the planar conductor is not formed. Therefore, the conductive member CM is able to be easily formed without masking or the like.

Further, according to the manufacturing method, the first interlayer connection conductor V1 is formed by forming a metal material near the one surface (the front surface of the resin layer 12) in the through hole AP1 having a truncated conical shape (a tapered shape) with the opening diameter reducing from the back surface of the resin layer 12 towards the front surface of the resin layer 12. According to such a configuration, the through hole AP1 has a tapered truncated conical shape, which makes it easy to permeate plating liquid into the through hole AP1, and easy to form a metal material in the through hole AP1. In addition, the through hole AP1 has a truncated conical shape, so that, in comparison with a case in which a through hole has a pillar or columnar shape, the first interlayer connection conductor V1 is able to be formed by a small amount of the metal material, and the cost is able to be reduced. Further, in a case in which the first interlayer connection conductor V1 is formed by a plating process, the first interlayer connection conductor V1 is able to be formed using a small amount of the metal material, so that the time required for the plating process is able to be reduced.

Figure 3:
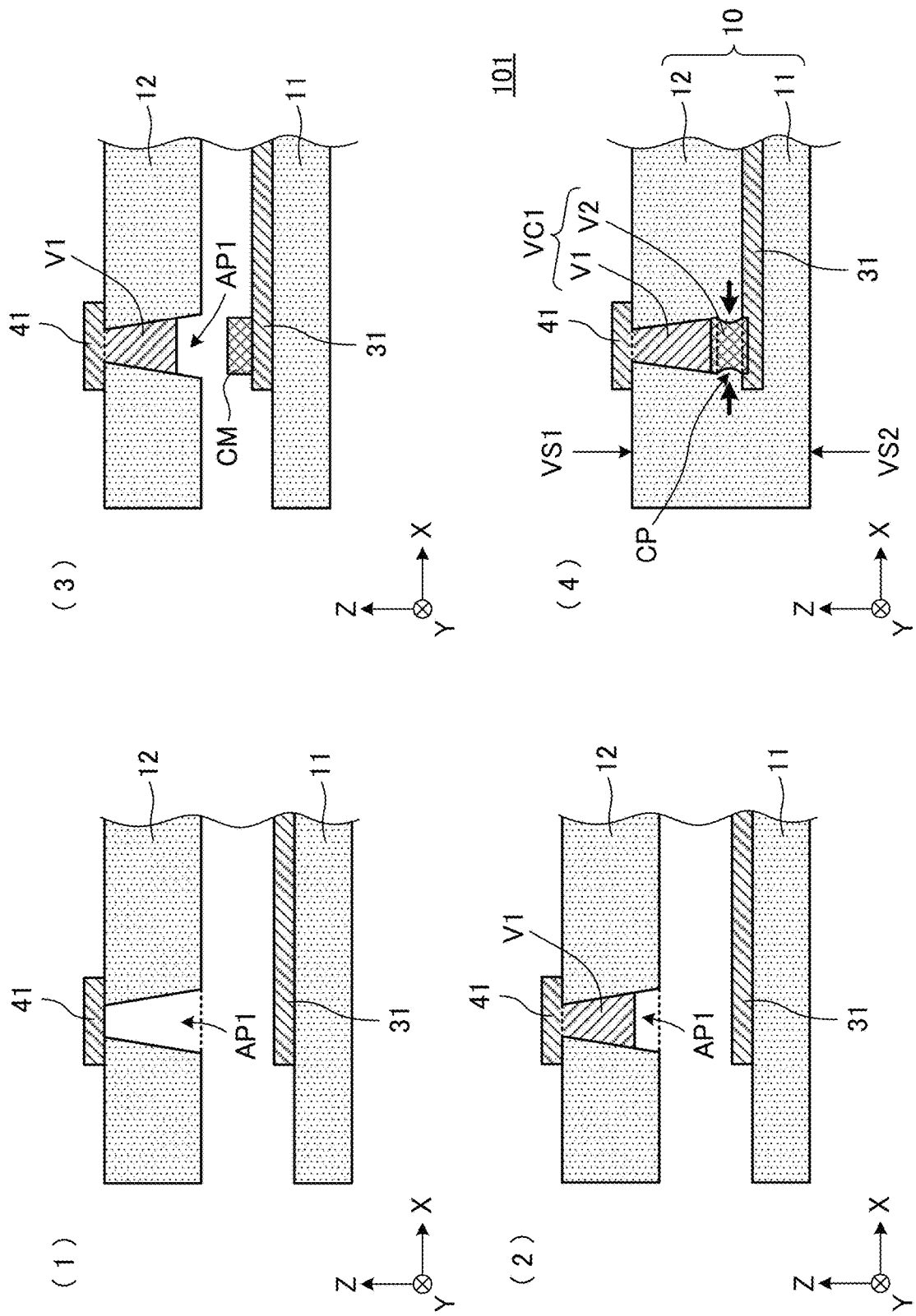
FIG. 3 is a cross-sectional view sequentially showing different steps of manufacturing the multilayer resin substrate 101.

It is to be noted that the multilayer resin substrate 101 according to the present preferred embodiment may be manufactured by, for example, the following steps. FIG. 3 is a cross-sectional view sequentially showing different steps of manufacturing the multilayer resin substrate 101.

First, as shown in (1) in FIG. 3, a plurality of resin layers 11 and 12 are prepared, and an internal conductor 31 and an external conductor 41 are respectively formed on the plurality of resin layers 11 and 12 (the planar conductor forming step).

Next, as shown in (2) in FIG. 3, a first interlayer connection conductor V1 is formed in the resin layer 12 (the first interlayer conductor forming step).

Subsequently, as shown in (3) in FIG. 3, a conductive member CM is formed at a portion of the internal conductor 31 that faces the first interlayer connection conductor V1 when the plurality of resin layers 11 and 12 are stacked in a subsequent step. The conductive member CM is conductive paste that includes metal powder including, for example, Cu and Sn or alloy including Cu and Sn and a resin material.

As described above, this step of forming the conductive member CM at a portion of the internal conductor 31 that faces the first interlayer connection conductor V1 when the plurality of resin layers 11 and 12 are stacked in a subsequent step, after the "first interlayer conductor forming step," is an example of a "conductive member forming step".

Next, as shown in (4) in FIG. 3, a stacked body 10 is formed by stacking, heating, and pressing of the plurality of resin layers 11 and 12 (the stacked body forming step). The conductive member CM defines and functions as the second interlayer connection conductor V2 by heat during heating and pressing, and subsequent cooling.

As shown in FIG. 3, in a case in which the conductive member CM is conductive paste including metal powder, and a resin material or a solvent, the conductive paste itself is soft and is easily deformed. In addition, in a case in which the metal powder is a low melting point metal, the conductive member CM is softened by being heated to a temperature equal to or higher than the melting point of the metal powder during heating and pressing.

During heating and pressing, a side surface of the conductive member CM that is easily deformed (or softened) is pressed by flowing resin, and is deformed (see the arrow shown in (4) in FIG. 3). As a result, a constricted portion CP having a smaller planar cross-sectional area than a different portion is formed between a bonding portion of the first interlayer connection conductor V1 and a bonding portion of the internal conductor 31, on the side of the second interlayer connection conductor V2 after heating and pressing.

Second Preferred Embodiment

In a second preferred embodiment of the present invention, an example of a multilayer resin substrate in which a different conductor is an interlayer connection conductor (a second interlayer connection conductor V2 is bonded to a first interlayer connection conductor V1 and a third interlayer connection conductor V3) will be described.

Figure 4:
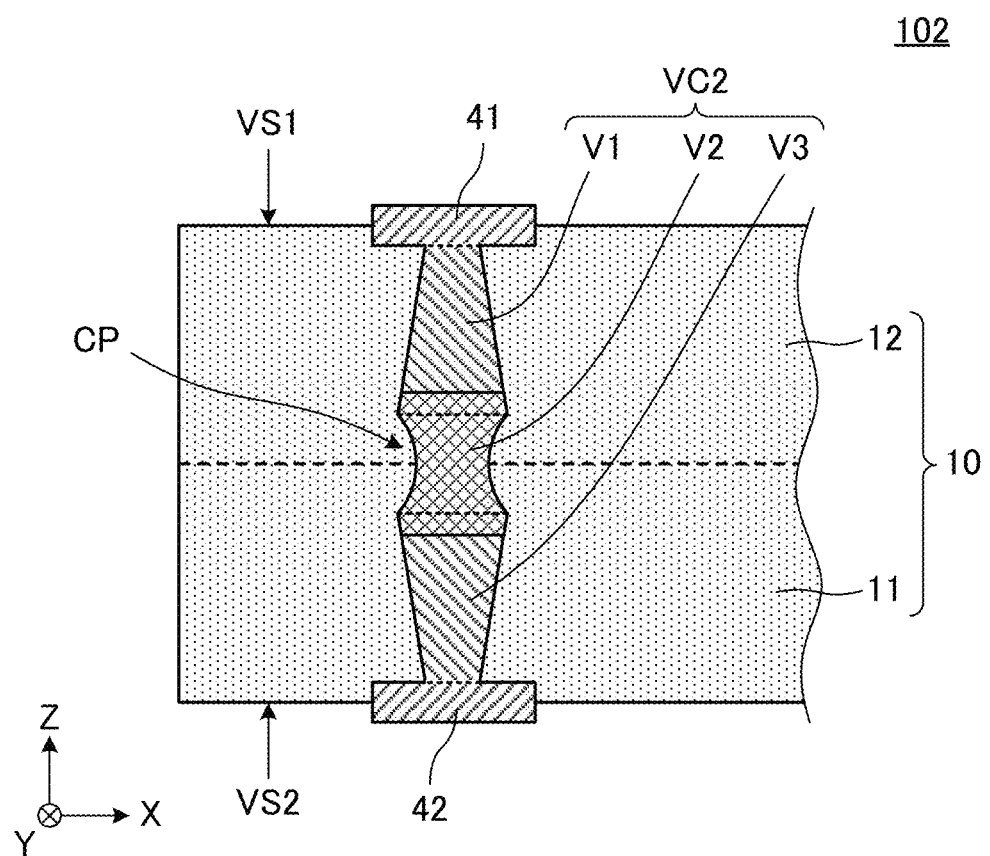
FIG. 4 is a cross-sectional view showing a portion of a multilayer resin substrate 102 according to a second preferred embodiment of the present invention.

FIG. 4 is a cross-sectional view showing a portion of a multilayer resin substrate 102 according to the second preferred embodiment.

The multilayer resin substrate 102 includes a stacked body 10, external conductors 41 and 42, and an interlayer connection conductor VC2 (a first interlayer connection conductor V1, a second interlayer connection conductor V2, and a third interlayer connection conductor V3). The multilayer resin substrate 102 is different from the multilayer resin substrate 101 according to the first preferred embodiment in that an internal conductor is not provided. In addition, the multilayer resin substrate 102 is different from the multilayer resin substrate 101 in that the interlayer connection conductor VC2 and the plurality of external conductors 41 and 42 are provided.

Hereinafter, the differences from the multilayer resin substrate 101 according to the first preferred embodiment will be described.

The interlayer connection conductor VC2 includes a first interlayer connection conductor V1, a second interlayer connection conductor V2, and a third interlayer connection conductor V3. As shown in FIG. 4, a rectangular or substantially rectangular external conductor 42 is provided on the back surface of the resin layer 11. The external conductor 42 is a conductor pattern such as Cu foil, for example. In addition, the third interlayer connection conductor V3 is provided in the resin layer 11. The third interlayer connection conductor V3 is connected to the external conductor 42, and the second interlayer connection conductor V2 is bonded to the first interlayer connection conductor V1 and the third interlayer connection conductor V3. In the present preferred embodiment, the external conductor 41 corresponds to the "first planar conductor", and the third interlayer connection conductor V3 corresponds to a "different conductor".

In the present preferred embodiment, the external conductors 41 and 42, the first interlayer connection conductor V1, and the third interlayer connection conductor V3 are made of the same material (for example, Cu). The third interlayer connection conductor V3 and the external conductor 42 are integrated together. The third interlayer connection conductor V3 is a plated via made of Cu as a main component, the plated via being provided inside a through hole provided in the resin layer 11 by a plating process, for example.

Figure 6:
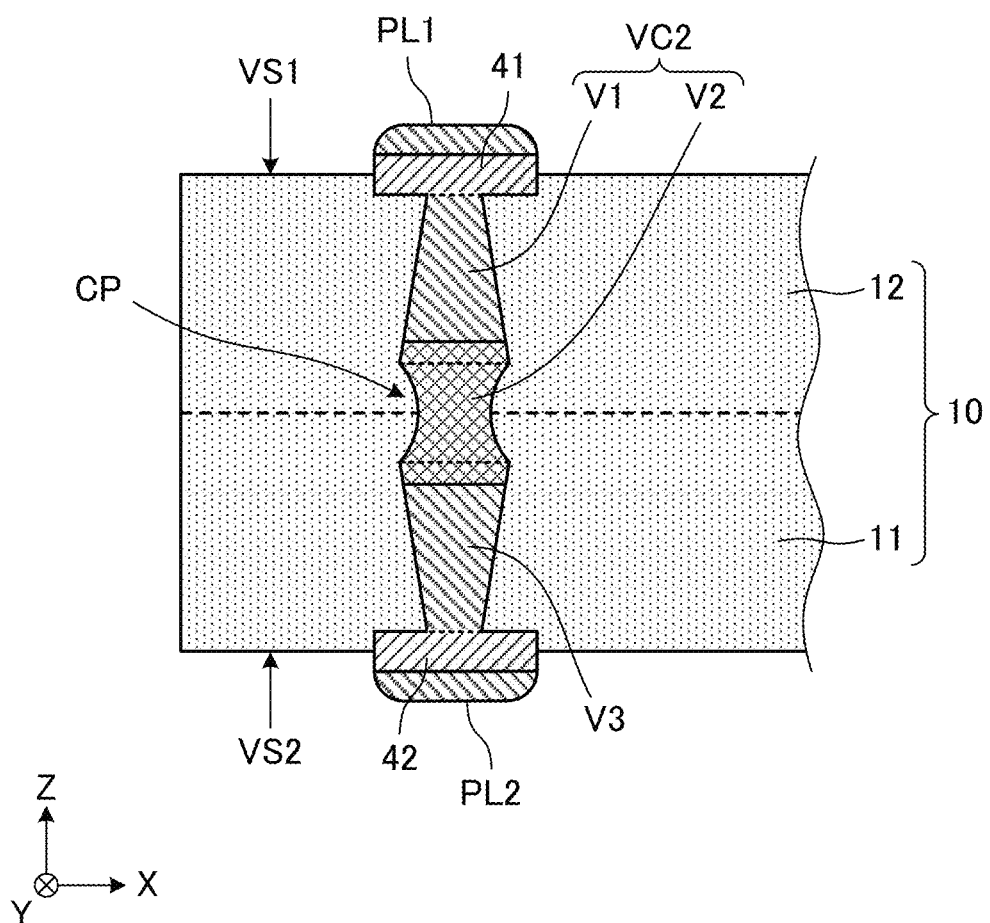
FIG. 6 is a cross-sectional view showing a portion of a multilayer resin substrate 103 according to a third preferred embodiment of the present invention.

In addition, in the present preferred embodiment, the third interlayer connection conductor V3 has a truncated conical shape (a tapered shape) with a smaller area on one surface (a bottom surface of the third interlayer connection conductor V3 in FIG. 6) and a larger area on an opposite surface (a top surface), and the one surface of the third interlayer connection conductor V3 is connected to the external conductor 42, and the opposite surface of the third interlayer connection conductor V3 is bonded to the second interlayer connection conductor V2.

In the present preferred embodiment, both of the first interlayer connection conductor V1 and the third interlayer connection conductor V3 have a truncated conical shape, and the opposite surfaces (surfaces with a larger area) of the first interlayer connection conductor V1 and the third interlayer connection conductor are bonded through the second interlayer connection conductor V2. According to such a configuration, in comparison with a case in which the one surfaces (surfaces with a smaller area) of the first interlayer connection conductor V1 and the third interlayer connection conductor V3 both of which have a truncated conical shape are bonded to each other, the occurrence of bonding failure resulting from a positional shift when the plurality of resin layers are stacked is able to be significantly reduced or prevented.

In addition, in the present preferred embodiment, the bonded surface between the first interlayer connection conductor V1 and the second interlayer connection conductor V2 is different from the bonded surface between the resin layer 11 and the resin layer 12 in the z direction (a stacking direction in which the resin layers of the multilayer resin substrate are stacked). As a result, peeling of the bonded surface between the first interlayer connection conductor V1 and the second interlayer connection conductor V2 and peeling of the bonded surface between the resin layer 11 and the resin layer 12 are able to be significantly reduced or prevented.

Figure 5:
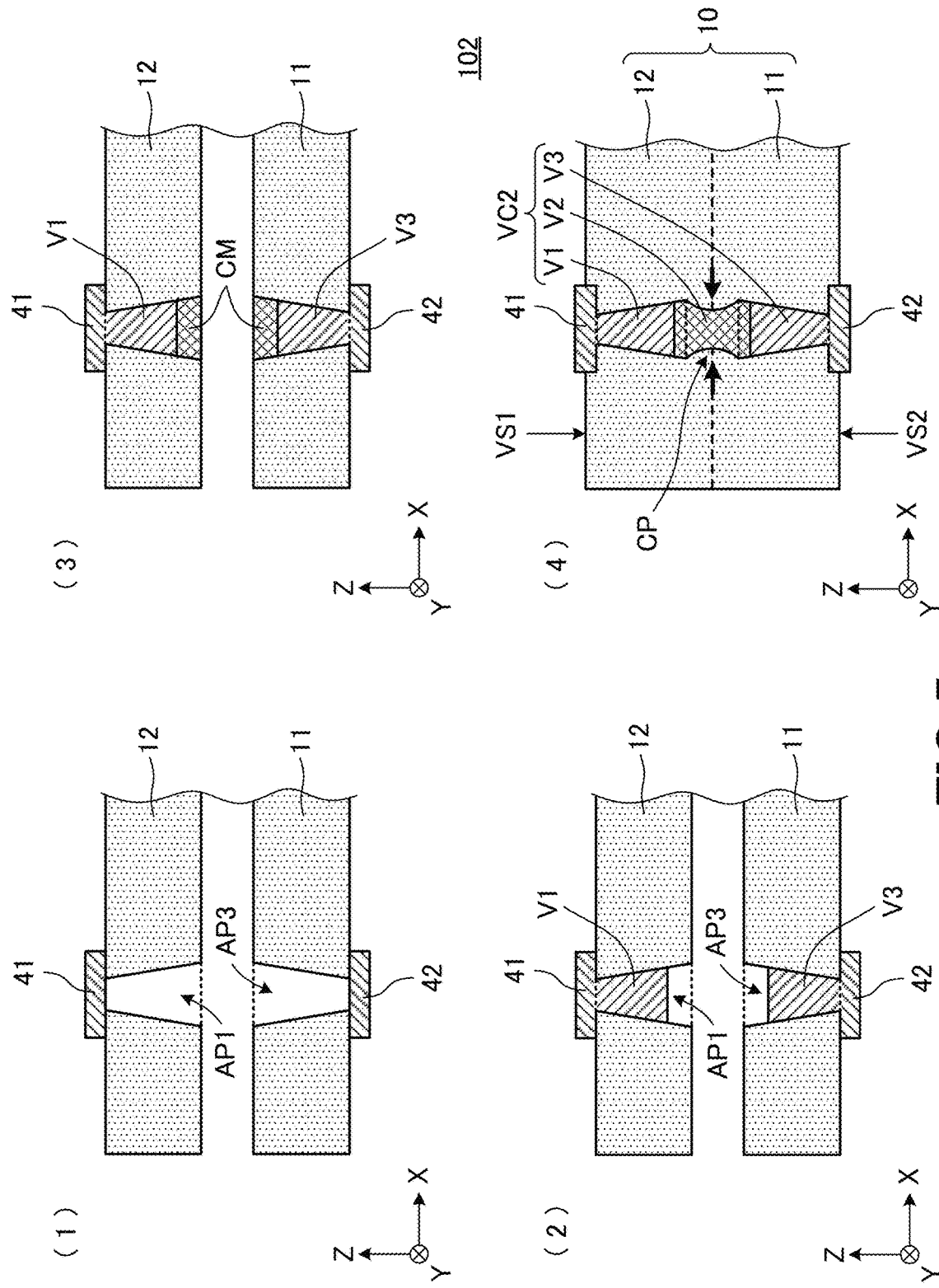
FIG. 5 is a cross-sectional view sequentially showing steps of manufacturing the multilayer resin substrate 102.

The multilayer resin substrate 102 according to the present preferred embodiment is manufactured, for example, in the following steps. FIG. 5 is a cross-sectional view sequentially showing steps of manufacturing the multilayer resin substrate 102.

First, as shown in (1) in FIG. 5, a plurality of resin layers 11 and 12 are prepared, and external conductors 41 and 42 are respectively formed on the plurality of resin layers 11 and (the planar conductor forming step).

Next, as shown in (2) in FIG. 5, a first interlayer connection conductor V1 is formed in the resin layer 12 (the first interlayer conductor forming step), and the third interlayer connection conductor V3 is formed in the resin layer 11. Specifically, after the "planar conductor forming step", a through hole AP1 is formed in the resin layer 12, and then the first interlayer connection conductor V1 is formed by forming a metal material (for example, Cu) inside the through hole AP1. In addition, after the "planar conductor forming step", a through hole AP3 is formed in the resin layer 11, and then the third interlayer connection conductor V3 is formed by forming a metal material (for example, Cu) inside the through hole AP3.

Subsequently, as shown in (3) in FIG. 5, a conductive member CM is formed on the resin layer 12, and a conductive member CM is formed on the resin layer 11 (the conductive member forming step). Specifically, the conductive member CM is disposed on the opposite surface (the bottom surface) of the first interlayer connection conductor V1, and the conductive member CM is disposed on the opposite surface (the top surface) of the third interlayer connection conductor V3.

Next, as shown in (3) and (4) in FIG. 5, a stacked body 10 is formed by stacking, heating, and pressing the plurality of resin layers 11 and 12 so that the conductive members CM come into contact with each other (the stacked body forming step). The conductive member CM is solidified by heat during heating and pressing, and subsequent cooling, and defines and functions as the second interlayer connection conductor V2.

Third Preferred Embodiment

In a third preferred embodiment of the present invention, an example of a multilayer resin substrate including a plating film provided on a surface of a planar conductor exposed to outside will be described.

FIG. 6 is a cross-sectional view showing a portion of a multilayer resin substrate 103 according to the third preferred embodiment of the present invention.

The multilayer resin substrate 103 is different from the multilayer resin substrate 102 according to the second preferred embodiment in that plating films PL1 and PL2 are respectively provided on the surfaces of the external conductors 41 and 42. Other configurations of the multilayer resin substrate 103 are the same or substantially the same as the configurations of the multilayer resin substrate 102.

Hereinafter, the differences from the multilayer resin substrate 102 according to the second preferred embodiment will be described.

As shown in FIG. 6, a plating film PL1 that is less likely to oxidize than the external conductor 41 is provided on the surface of the external conductor 41. In addition, a plating film PL2 that is less likely to oxidize than the external conductor 42 is provided on the surface of the external conductor 42. As described above, corrosion resistance of the external conductors 41 and 42 is increased by the plating films PL1 and PL2 on the surface of the external conductors 41 and 42. The plating films PL1 and PL2 are plating films made of Ni—Au or the like provided on each of the surfaces of the external conductors 41 and 42 being conductor patterns of Cu, for example.

The plating films PL1 and PL2, after the stacked body 10 (after the "stacked body forming step") is formed, for example, are formed on the external conductors 41 and 42 exposed to the surface of the stacked body 10 by an electroplating method (for example, an electrolytic plating method).

The step of forming plating films PL1 and PL2 on a planar conductor is an example of the "plating forming step".

Fourth Preferred Embodiment

In a fourth preferred embodiment of the present invention, an example in which a position of a constricted portion CP is different from the example of the first preferred embodiment will be described. Hereinafter, a portion different from the portion of the first preferred embodiment will be described.

Figure 7:
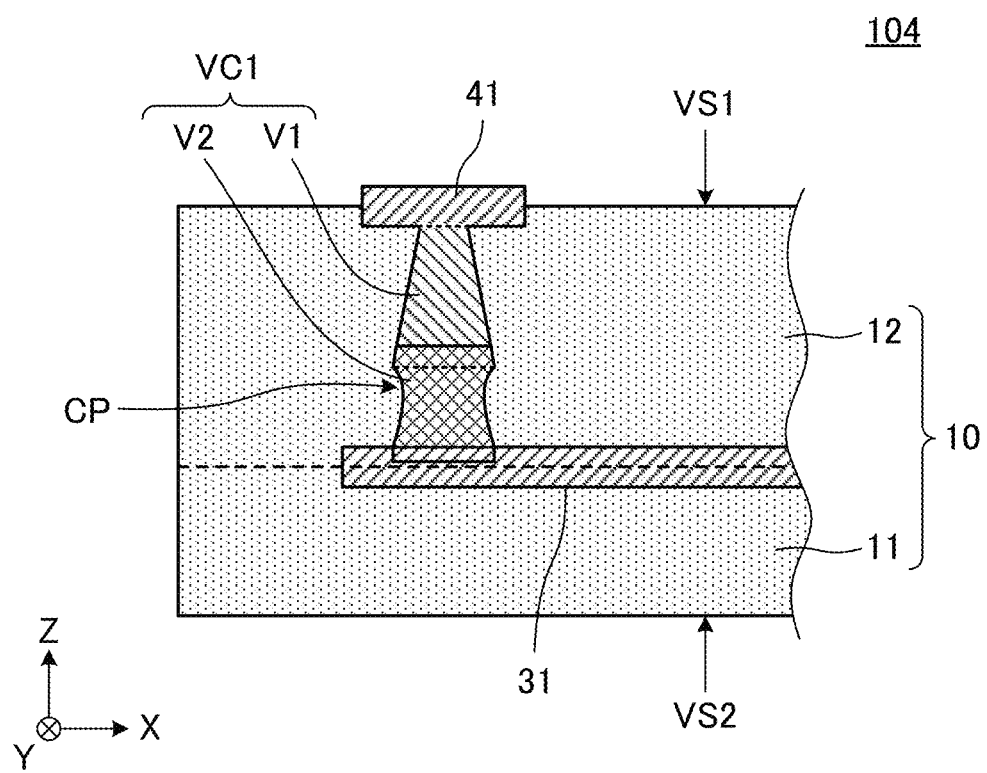
FIG. 7 is a cross-sectional view showing a portion of a multilayer resin substrate 104 according to a fourth preferred embodiment of the present invention.

FIG. 7 is a cross-sectional view showing a portion of a multilayer resin substrate 104 according to the fourth preferred embodiment.

As shown in FIG. 7, in the multilayer resin substrate 104, the constricted portion CP is shifted from a central position between the bonded surface between the second interlayer connection conductor V2 and the first interlayer connection conductor V1 and the bonded surface between the second interlayer connection conductor V2 and the internal conductor 31 in the z direction. Even in such a configuration, a portion on which stress concentrates is able to be separated from each bonded surface. Accordingly, peeling of each bonded surface is able to be significantly reduced or prevented.

Fifth Preferred Embodiment

In a fifth preferred embodiment of the present invention, an example in which a shape of a first interlayer connection conductor V1 is different from the example of the first preferred embodiment will be described. Hereinafter, a portion different from the portion of the first preferred embodiment will be described.

Figure 8:
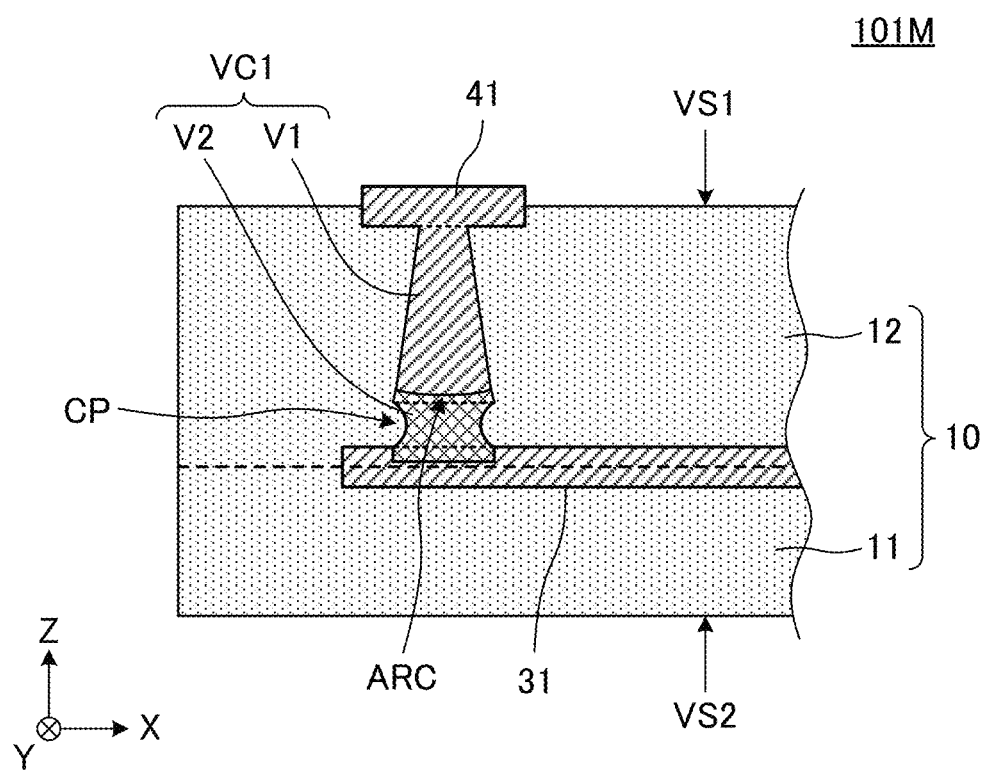
FIG. 8 is a cross-sectional view showing a portion of a multilayer resin substrate 101M according to a fifth preferred embodiment of the present invention.

FIG. 8 is a cross-sectional view showing a portion of a multilayer resin substrate 101M according to the fifth preferred embodiment.

As shown in FIG. 8, in the multilayer resin substrate 101M, a surface of the first interlayer connection conductor V1, that is, a surface of the first interlayer connection conductor V1 opposite to the bonded surface with the external conductor 41 includes a dome-shaped end surface ARC of which the central portion protrudes with respect to an end portion. This is easily produced in a case in which the first interlayer connection conductor V1 is a plated via.

In such a case, the constricted portion CP included in the second interlayer connection conductor V2 causes the three-dimensional shape of the second interlayer connection conductor V2 to follow the shape of the dome-shaped end surface ARC. As a result, the stress generated on the bonded surface is able to be reduced.

Other Preferred Embodiments

While each of the above-described preferred embodiments shows an example in which the stacked body 10 is a rectangular or substantially rectangular flat plate, the present invention is not limited to such a configuration. The shape of the stacked body 10 is able to be appropriately changed within the scope of advantageous functions and effects of the preferred embodiments of the present invention. The planar shape of the stacked body 10 may be a polygon, a circle, an ellipse, an L shape, a crank shape, a T shape, a Y shape, a U shape, or the like, for example.

In addition, while each of the above described preferred embodiments shows an example in which the stacked body 10 includes two resin layers 11 and 12 that are stacked on each other, the present invention is not limited to such a configuration. The number of resin layers included in the stacked body 10 is able to be appropriately changed within the scope of operations and features of the preferred embodiments of the present invention. Moreover, a protective layer such as a cover lay film, a solder resist film, or an epoxy resin film or the like, for example, may be provided on the surface of the stacked body 10.

While each of the above described preferred embodiments shows an example in which the stacked body 10 is provided by stacking the plurality of resin layers 11 and 12 made of a thermoplastic resin, the present invention is not limited to such a configuration. The plurality of resin layers may be sheets made of a thermosetting resin, for example. In addition, the stacked body 10 may be a composite stacked body including a plurality of resins or may be configured by stacking a thermosetting resin sheet such as glass epoxy substrate and a thermoplastic resin sheet, for example. Further, the stacked body 10 is not limited to a stacked body including a plurality of resin layers of which the surfaces are fused by heating and pressing (collectively pressing) the plurality of resin layers, and may include an adhesive layer between each of the plurality of resin layers.

While each of the above described preferred embodiments shows an example in which the external conductor 41 corresponds to the "first planar conductor", the present invention is not limited to such a configuration. The "first planar conductor" may be an internal conductor provided inside the stacked body 10.

In addition, the circuit configuration provided on the multilayer resin substrate is able to be appropriately changed within the scope of operations and features of the preferred embodiments of the present invention. For example, a coil defined by a conductor pattern, a capacitor defined by a conductor pattern, or a frequency filter, such as various filters (a low-pass filter, a high-pass filter, a band-pass filter, a band-elimination filter) may be provided in the circuit configuration provided in the multilayer resin substrate. Moreover, for example, other various transmission lines (such as a strip line, a microstrip line, a coplanar line, or the like) may be provided on the multilayer resin substrate. Further, various electronic components such as, for example, a chip component may be mounted on or embedded in the multilayer resin substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer resin substrate comprising:
    a stacked body including a plurality of resin layers stacked on each other;
    a first planar conductor on one of the plurality of resin layers; and
    an interlayer connection conductor on one of the plurality of resin layers and connected to the first planar conductor; wherein
    the interlayer connection conductor includes a first interlayer connection conductor, and a second interlayer connection conductor made of a material different from a material of the first interlayer connection conductor and bonded to the first interlayer connection conductor;
    the first interlayer connection conductor has a truncated conical shape with a smaller area on one surface and a larger area on an opposite surface;
    the one surface of the first interlayer connection conductor is connected to the first planar conductor, and the opposite surface of the first interlayer connection conductor is bonded to the second interlayer connection conductor; and
    the second interlayer connection conductor includes a constricted portion having a smaller planar cross-sectional area than a different portion thereof, between a bonding portion to which the first interlayer connection conductor is bonded and a bonding portion to which a different conductor is bonded.

2. The multilayer resin substrate according to claim 1, wherein the plurality of resin layers are made of a thermoplastic resin.

3. The multilayer resin substrate according to claim 1, wherein the different conductor is a second planar conductor on one of the plurality of resin layers.

4. The multilayer resin substrate according to claim 1, wherein the material of the second interlayer connection conductor has a lower melting point than the material of the first interlayer connection conductor.

5. The multilayer resin substrate according to claim 1, wherein the first interlayer connection conductor and the second interlayer connection conductor include no resin material.

6. The multilayer resin substrate according to claim 1, wherein
    the first interlayer connection conductor is connected to the first planar conductor; and
    the first interlayer connection conductor and the first planar conductor are made of a same material.

7. The multilayer resin substrate according to claim 1, wherein
    the plurality of resin layers are sheets including a liquid crystal polymer as a main material;
    the first planar conductor and the first interlayer connection conductor include Cu as a main component; and
    the second interlayer connection conductor includes Cu—Sn alloy as a main component.

8. The multilayer resin substrate according to claim 1, wherein a bonded surface of the plurality of resin layers and the constricted portion are located at different positions in a stacking direction of the plurality of resin layers.

9. The multilayer resin substrate according to claim 1, wherein a bonded surface of the plurality of resin layers and a bonded surface between the first interlayer connection conductor and the second interlayer connection conductor are located at different positions in a stacking direction of the plurality of resin layers.

10. The multilayer resin substrate according to claim 1, wherein a thickness of the first interlayer connection conductor is larger than a thickness of the second interlayer connection conductor.

* * * * *